US012619158B2

(12) United States Patent
Van Kraaij

(10) Patent No.: US 12,619,158 B2
(45) Date of Patent: May 5, 2026

(54) METROLOGY TARGET SIMULATION

(71) Applicant: ASML Netherlands B.V., Veldhoven (NL)

(72) Inventor: Markus Gerardus Martinus Maria Van Kraaij, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 366 days.

(21) Appl. No.: 18/265,755

(22) PCT Filed: Dec. 8, 2021

(86) PCT No.: PCT/EP2021/084829
§ 371 (c)(1),
(2) Date: Jun. 7, 2023

(87) PCT Pub. No.: WO2022/128687
PCT Pub. Date: Jun. 23, 2022

(65) Prior Publication Data
US 2024/0118625 A1      Apr. 11, 2024

(30) Foreign Application Priority Data
Dec. 18, 2020     (EP) .................................... 20215517

(51) Int. Cl.
*G03F 7/00*        (2006.01)
*G03F 9/00*        (2006.01)
(52) U.S. Cl.
CPC .......... *G03F 7/705* (2013.01); *G03F 7/70633* (2013.01); *G03F 9/7076* (2013.01)
(58) Field of Classification Search
CPC ..... G03F 7/705; G03F 7/70633; G03F 9/7076
See application file for complete search history.

(56) References Cited

U.S. PATENT DOCUMENTS 6,952,253 B2     10/2005 Lof et al.
2007/0242256 A1*  10/2007 Van De Kerkhof .... G03F 7/706
                                                      355/71
(Continued)

FOREIGN PATENT DOCUMENTS

EP           3 474 074 A1     4/2019

OTHER PUBLICATIONS

International Search Report and Written Opinion of the International Searching Authority directed to International Patent Application No. PCT/EP2021/084829, mailed Mar. 10, 2022; 11 pages.
(Continued)

*Primary Examiner* — Afroza Chowdhury
(74) *Attorney, Agent, or Firm* — Finnegan, Henderson, Farabow, Garrett & Dunner, LLP

(57)          ABSTRACT

A method of simulating an electromagnetic response of a metrology target comprising first and second gratings, wherein the second grating is below the first grating, the method comprising: receiving a model defining (i) the first grating as having a first number of grating lines within a pitch, each of the first number of grating lines separated by a first pitch; and (ii) the second grating as having a second number of grating lines within the pitch, each of the second number of grating lines separated by a second pitch; using the model and the first pitch to simulate properties of the first grating and generate a first scattering matrix; using the model and the second pitch to simulate properties of the second grating and generate a second scattering matrix; generating a scattering matrix defining properties of the metrology target by combining the first scattering matrix and the second scattering matrix.

15 Claims, 12 Drawing Sheets

(56)     References Cited

U.S. PATENT DOCUMENTS

| | | | |
|---|---|---|---|
| 2013/0035911 A1 | 2/2013 | Pisarenco et al. | |
| 2013/0144560 A1 | 6/2013 | Pisarenco et al. | |
| 2018/0024054 A1* | 1/2018 | Moon ................. | G03F 7/70633 |
| | | | 382/181 |
| 2019/0113452 A1* | 4/2019 | Pisarenco ........... | G03F 7/70341 |
| 2021/0055215 A1* | 2/2021 | Pisarenco ............ | G03F 7/7015 |

OTHER PUBLICATIONS

International Preliminary Report on Patentability directed to International Patent Application No. PCT/EP2021/084829, issued Jun. 13, 2023; 8 pages.

Nevière M., "Bragg-Fresnel multilayer gratings: electromagnetic theory," Journal of the Optical Society of America A, vol. 11, No. 6, Jun. 1994; pp. 1835-1845.

Van Kraaij M.G.M.M., "A more Rigorous Coupled-Wave Analysis," Master's Thesis, Technische Universiteit Eindhoven, Department of Mathematics and Computing Science, Jun. 2004; 123 pages.

* cited by examiner

700

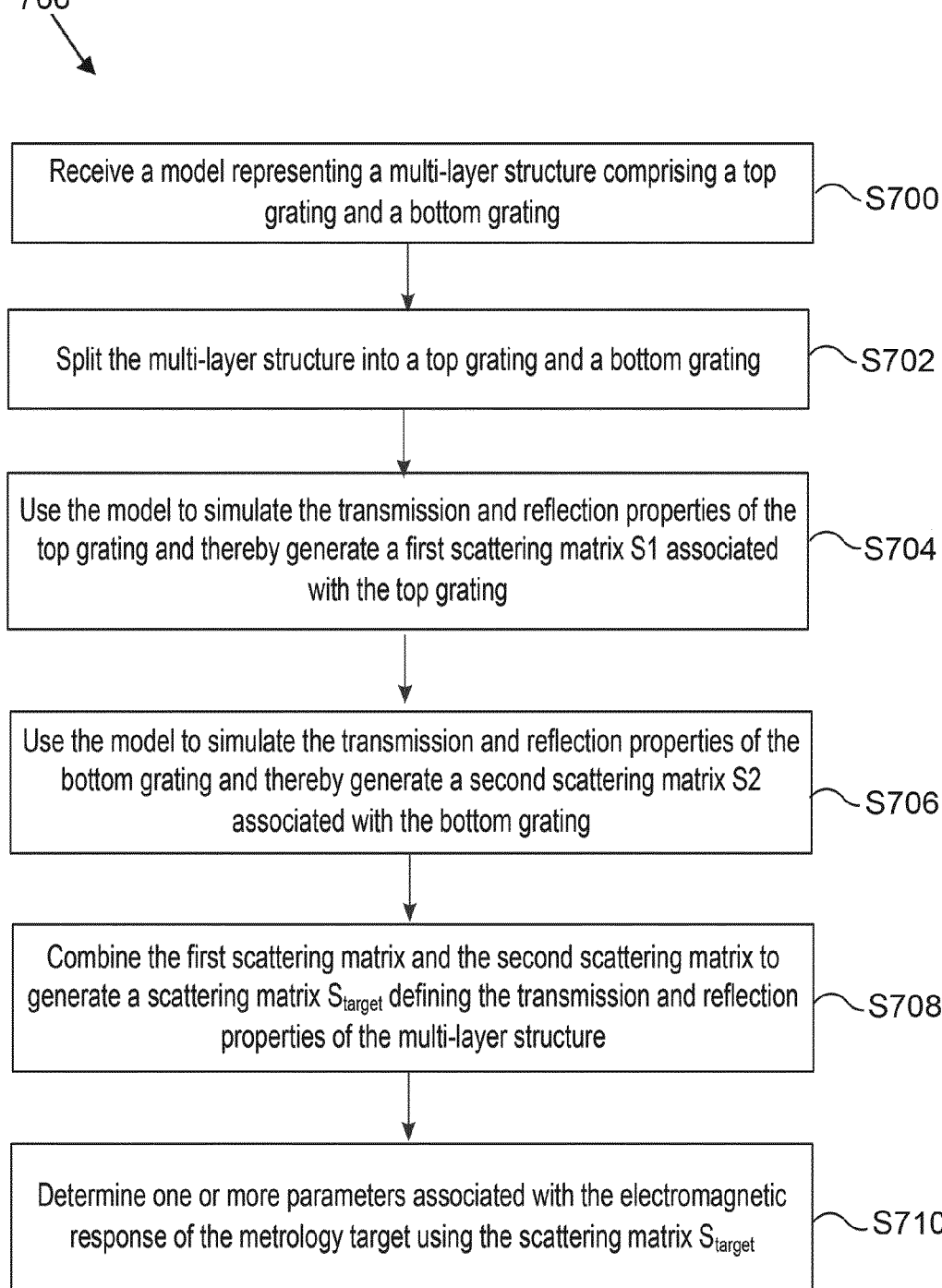

Receive a model representing a multi-layer structure comprising a top grating and a bottom grating — S700

Split the multi-layer structure into a top grating and a bottom grating — S702

Use the model to simulate the transmission and reflection properties of the top grating and thereby generate a first scattering matrix S1 associated with the top grating — S704

Use the model to simulate the transmission and reflection properties of the bottom grating and thereby generate a second scattering matrix S2 associated with the bottom grating — S706

Combine the first scattering matrix and the second scattering matrix to generate a scattering matrix $S_{target}$ defining the transmission and reflection properties of the multi-layer structure — S708

Determine one or more parameters associated with the electromagnetic response of the metrology target using the scattering matrix $S_{target}$ — S710

Fig. 7a $$S_1 = [S_1^{11}, S_1^{12}, S_1^{21}, S_1^{22}]$$

$$S_{topBD} = \begin{bmatrix} S_{top\,1} & 0 & 0 \\ 0 & S_{top\,2} & 0 \\ 0 & 0 & S_{top\,3} \end{bmatrix}$$

S704

$S_2^{11}$ $S_2^{21}$ $$S_2 = [S_2^{11}; S_2^{21}]$$

$=$ $$S_{botBD} = \begin{bmatrix} S_{bot\,1} & 0 \\ 0 & S_{bot\,2} \end{bmatrix}$$

S706

METROLOGY TARGET SIMULATION

CROSS-REFERENCE TO RELATED APPLICATIONS

This application claims priority of EP application 20215517.2 which was filed on Dec. 18, 2020 and which is incorporated herein in its entirety by reference.

TECHNICAL FIELD

The present invention relates to metrology target simulation. In particular, the present invention relates to a computer implemented method of simulating an electromagnetic response of a metrology target having a multi-layer structure.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where, is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Semiconductor-based devices may be produced by fabricating a series of layers on a substrate (e.g., a wafer), some or all of the layers including various structures. The relative position of these structures within a single layer and with respect to structures in other layers plays a key role in the performance of the devices. Overlay error relates to the misalignment between various structures. Overlay accuracy generally pertains to the determination of how accurately a first patterned layer aligns with respect to a second patterned layer disposed above or below it and to the determination of how accurately a first pattern aligns with respect to a second pattern disposed on the same layer. Overlay measurements are performed via metrology targets that are printed together with layers of the wafer. Images of the metrology targets are captured via an imaging tool and are analyzed to determine both X-overlay and Y-overlay measurements.

Known techniques exist to simulate an electromagnetic response of a metrology target in software before fabricating them onto a substrate. This simulation enables a designer to determine one or more parameters associated with the electromagnetic response of the metrology target and make changes to the design of the metrology target to optimize the one or more parameters.

SUMMARY

Known techniques for simulating an electromagnetic response of a metrology target are typically applied to metrology targets comprising a multi-layer structure comprising an upper grating and a lower grating, wherein the grating lines of the upper grating and the lower grating have the same pitch. This involves rigorously simulating the electromagnetic response of the metrology target using Maxwell solvers, e.g. using Rigorous Coupled-Wave Analysis (RCWA), for various parameters of light incident on the metrology target and for different critical dimensions (CD) and pitches of the metrology target.

The inventor has identified that when the grating lines of the upper grating and the lower grating are not equal, i.e. have different pitches, the computational complexity of the simulation increases such that using known Maxwell solving techniques take a much greater length of time making the use of known Maxwell solving techniques for such a metrology target design impractical or sometimes even impossible.

According to one aspect of the present disclosure there is provided a computer implemented method of simulating an electromagnetic response of a metrology target having a multi-layer structure comprising a first grating and a second grating, wherein the second grating is below the first grating in the multi-layer structure, the method comprising: receiving a model representing the multi-layer structure, the model defining (i) the first grating as having a first predetermined number of grating lines within a pitch of the multi-layer structure, each of the first predetermined number of grating lines separated by a first pitch; and (ii) the second grating as having a second predetermined number of grating lines within the pitch of the multi-layer structure, each of the second predetermined number of grating lines separated by a second pitch; using the model and the first pitch to simulate the transmission and reflection properties of the first grating and generate a first scattering matrix associated with the first grating; using the model and the second pitch to simulate the transmission and reflection properties of the second grating and generate a second scattering matrix associated with the second grating; generating a scattering matrix defining the scattering and reflection properties of the multi-layer structure by combining the first scattering matrix and the second scattering matrix.

Embodiments of the present disclosure exploit "sparsity" in the Maxwell solver solution which is present when the first (upper) grating and the second (lower) grating are unequal, i.e. the first pitch and the second pitch are different. In particular, the computational resource needed to simulate the electromagnetic response of such a metrology target is minimized to thereby reduce the time taken to perform the simulation.

The method may comprise: using the model and the first pitch to simulate the transmission and reflection properties of the first grating to generate a first block-diagonal matrix associated with the first grating; and reordering the first block-diagonal matrix to generate the first scattering matrix associated with the first grating The first block-diagonal matrix may comprise scattering matrices each defining the transmission and reflection properties of the first grating in response to simulating light being incident on an upper surface of the first grating at a respective angle of incidence and being incident on a lower surface of the first grating at a respective angle.

The first block-diagonal matrix may comprise the first predetermined number of scattering matrices.

The method may comprise: using the model and the second pitch to simulate the transmission and reflection properties of the second grating to generate a second block-diagonal matrix associated with the second grating; and reordering the second block-diagonal matrix to generate the second scattering matrix associated with the second grating.

The second block-diagonal matrix may comprise scattering matrices each defining the transmission and reflection properties of the second grating in response to simulating light being incident on an upper surface of the second grating at a respective angle of incidence.

The second block-diagonal matrix may comprise the second predetermined number of scattering matrices.

The first scattering matrix may comprise: (i) a first scattering matrix component defining the transmission properties of the first grating in response to simulating light being incident on an upper surface of the first grating, (ii) a second scattering matrix component defining the reflection properties of the first grating in response to simulating light being incident on an upper surface of the first grating, (iii) a third scattering matrix component defining the reflection properties of the first grating in response to simulating light being incident on a lower surface of the first grating, and (iv) a fourth scattering matrix component defining the transmission properties of the first grating in response to simulating light being incident on a lower surface of the first grating; wherein the second scattering matrix may comprise: (v) a fifth scattering matrix component defining the transmission properties of the second grating in response to simulating light being incident on an upper surface of the second grating, and (vi) a sixth scattering matrix component defining the reflection properties of the first grating in response to simulating light being incident on an upper surface of the second grating, The combining of the first scattering matrix and the second scattering matrix may comprise performing a matrix inversion of a matrix obtained by subtracting the product of the third scattering matrix component and the sixth scattering matrix component from an identity matrix.

The combining the first scattering matrix and the second scattering matrix may comprise approximating a matrix inversion of a matrix obtained by subtracting the product of the third scattering matrix component and the sixth scattering matrix component from an identity matrix.

The approximating the matrix inversion may comprise using a geometric series or comprise using an iterative solver.

The scattering matrix defining the scattering and reflection properties of the multi-layer structure may be generated by the Redheffer product of the first scattering matrix and the second scattering matrix.

The method may further comprise determining one or more parameters associated with the electromagnetic response of the metrology target using the scattering matrix defining the transmission and reflection properties of the multi-layer structure.

In implementations, the first predetermined number of grating lines is greater than the second predetermined number of grating lines such that the first pitch is less than the second pitch.

In implementations, the first predetermined number of grating lines may be less than the second predetermined number of grating lines such that the first pitch is greater than the second pitch.

In implementations, the first predetermined number of grating lines are identical to each other, and the second predetermined number of grating lines are identical to each other.

According to one aspect of the present disclosure there is provided a computer implemented method of designing a metrology target for a semiconductor wafer, the metrology target having a multi-layer structure comprising a first grating and a second grating, wherein the second grating is below the first grating in the multi-layer structure, the method comprising: for each of a plurality of candidate metrology targets, performing the method of any preceding claim and determining one or more parameters associated with the electromagnetic response of the candidate metrology target using the scattering matrix of the candidate metrology target; identifying a candidate metrology target from said plurality of candidate metrology targets that optimizes said one or more parameters.

According to another aspect of the present disclosure there is provided a computing device comprising a processor and memory, the memory storing instructions which, when executed by the processor cause the computing device to perform the method steps described herein.

According to another aspect of the present disclosure there is provided a computer-readable storage medium comprising instructions which, when executed by a processor of a computing device cause the computing device to perform the method steps described herein.

The instructions may be provided on a carrier such as a disk, CD- or DVD-ROM, programmed memory such as read-only memory (Firmware), or on a data carrier such as an optical or electrical signal carrier. Code (and/or data) to implement embodiments of the present disclosure may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language.

BRIEF DESCRIPTION OF THE DRAWINGS

Embodiments of the invention will now be described, by way of example only, with reference to the accompanying schematic drawings, in which:

FIG. 7a illustrates a process of simulating an electromagnetic response of a metrology target;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
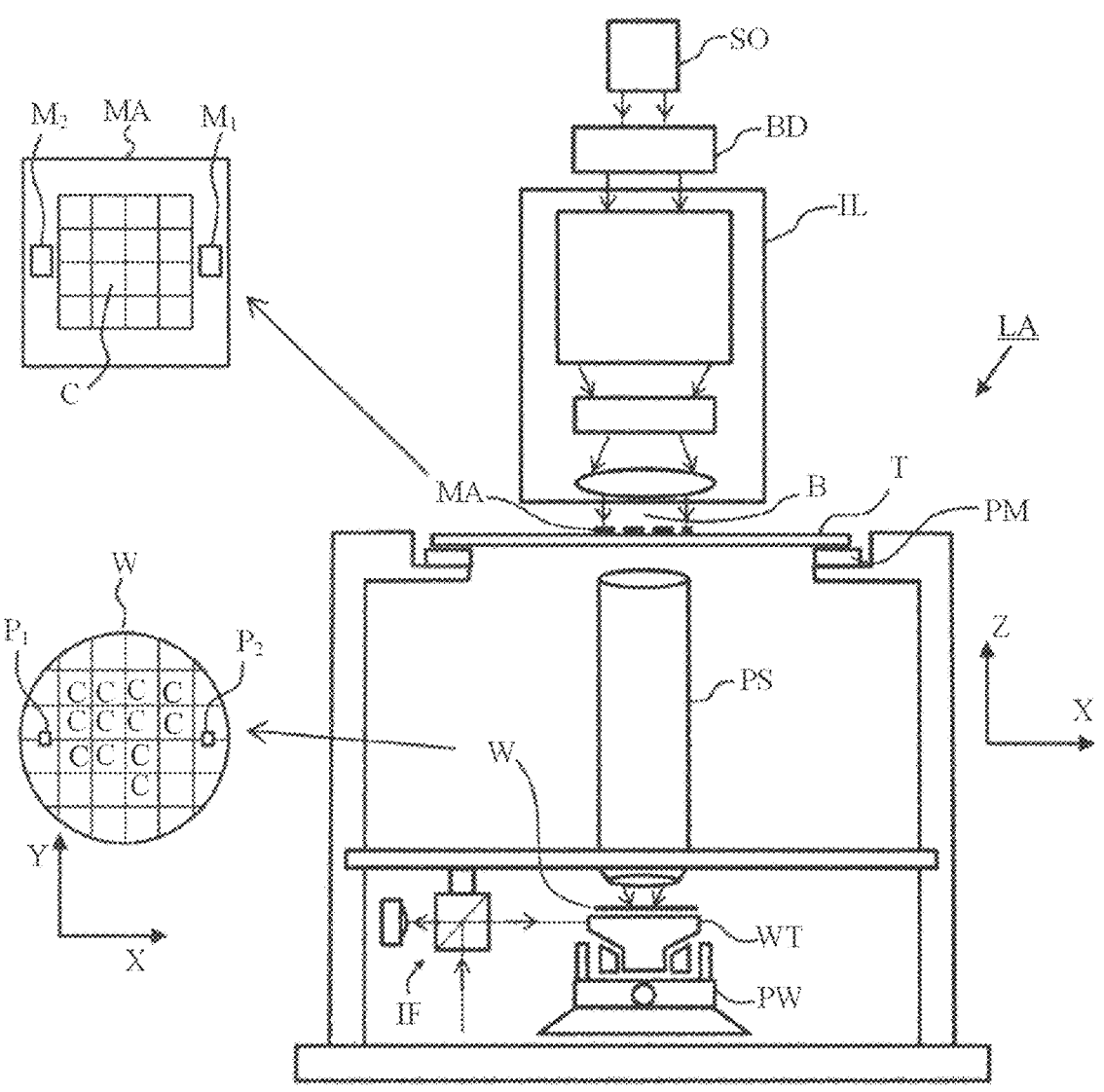
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout)

present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
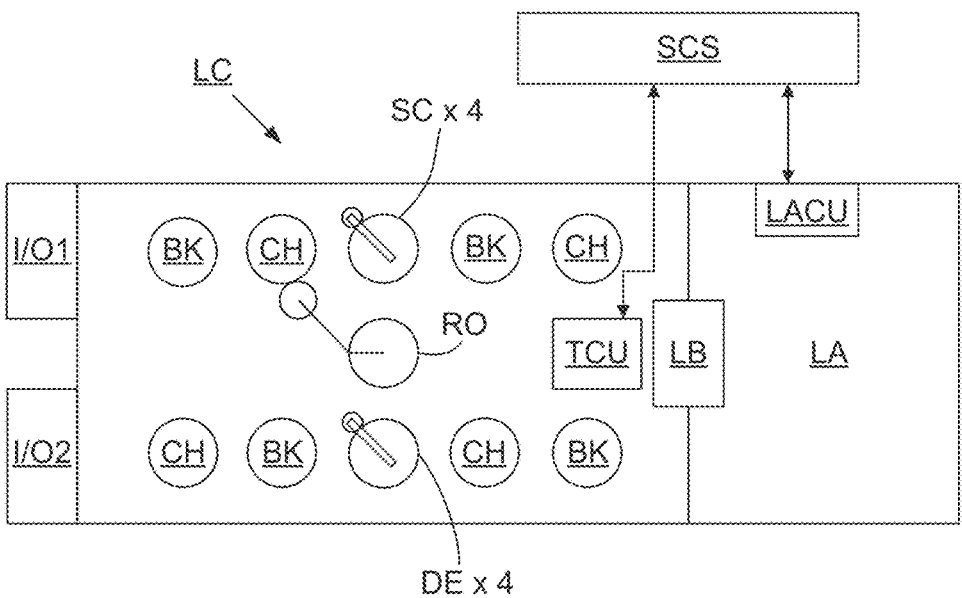
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
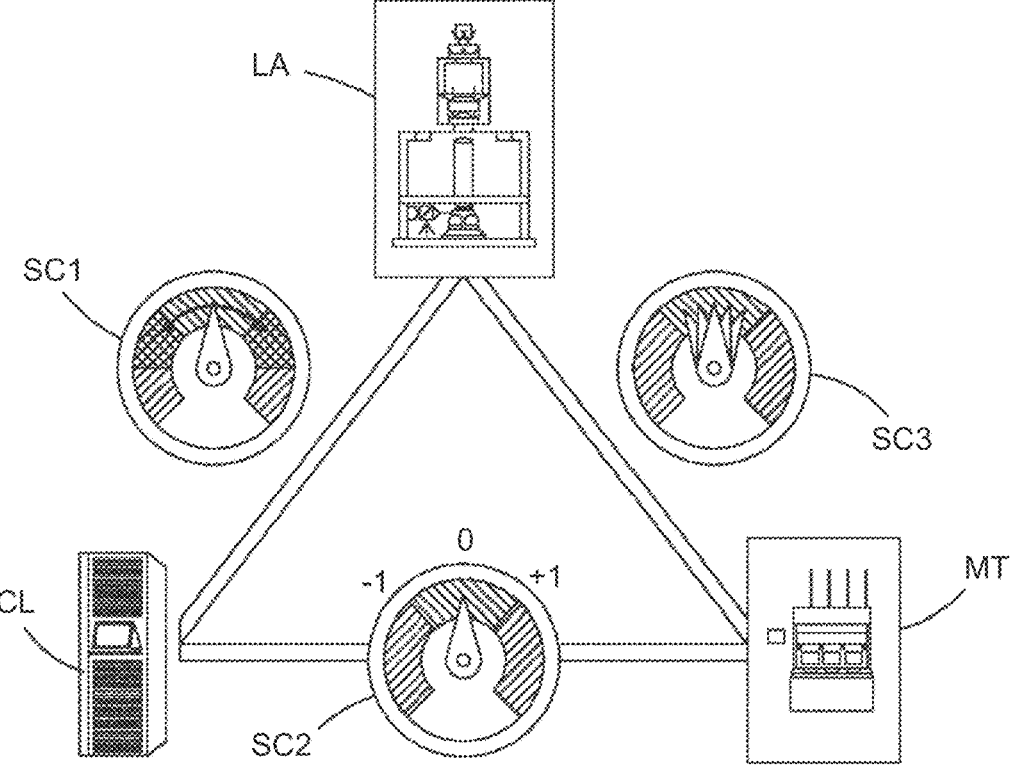
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

A metrology target on the substrate W is used to determine the alignment of different layers of the same substrate W. Embodiments of the present disclosure relate to the software simulation of an electromagnetic response of a candidate metrology target as part of a design process for determining an optimal metrology target that is to be manufactured on a substrate W. The simulation method described herein is performed on a computing device 400. The computing device 400 may be the same as, or a separate device to, the computer system CL.

Figure 4:
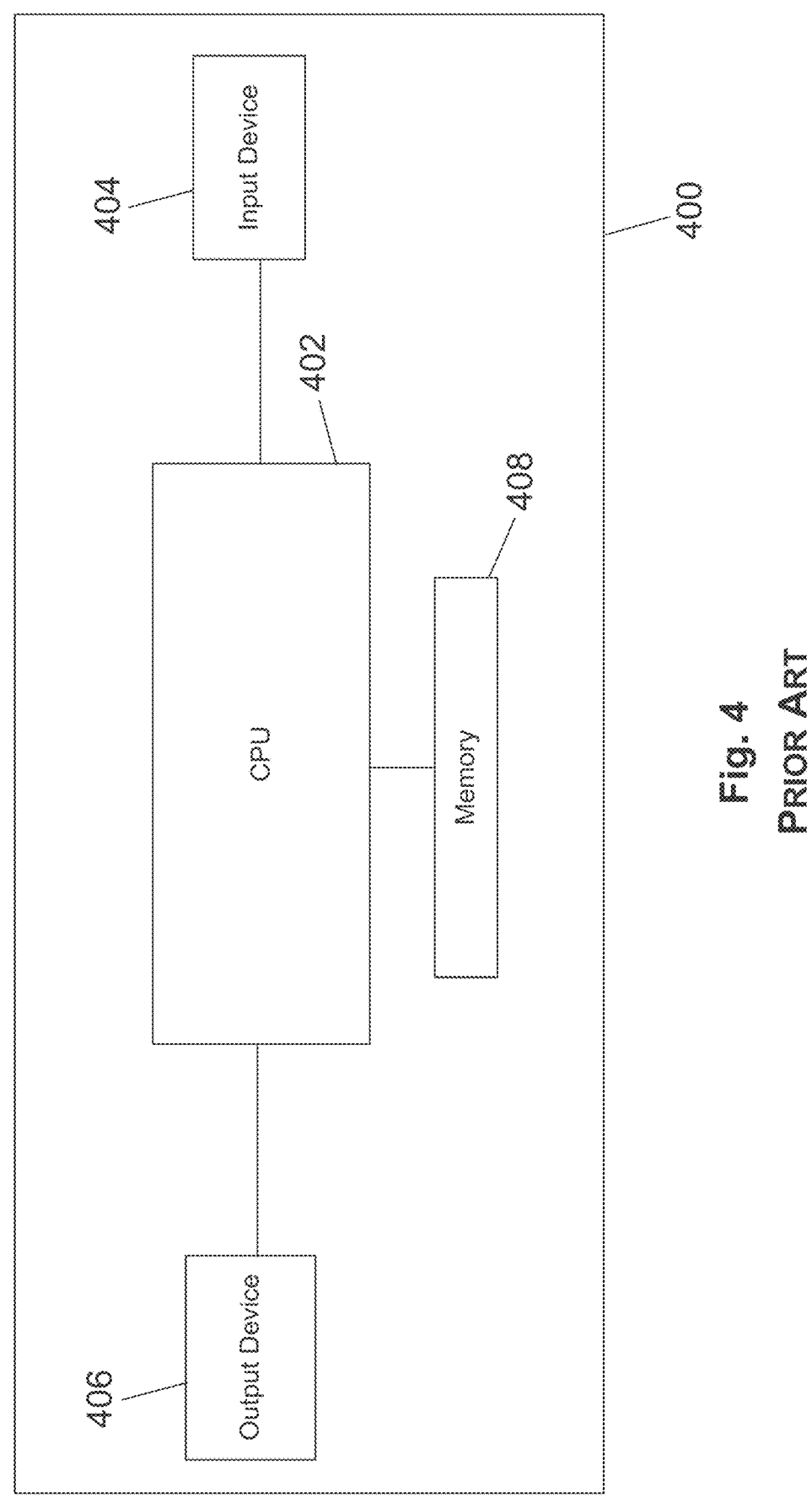
FIG. 4 schematically depicts an example computing device on which embodiments can be implemented.

FIG. 4 illustrates a simplified view of the computing device 400. A shown in FIG. 4, the device 402 comprises a central processing unit ("CPU") 202, to which is connected a memory 408. The functionality of the CPU 402 described herein may be implemented in code (software) stored on a memory (e.g. memory 408) comprising one or more storage media, and arranged for execution on a processor comprising on or more processing units. The storage media may be integrated into and/or separate from the CPU 402. The code is configured so as when fetched from the memory and executed on the processor to perform operations in line with embodiments discussed herein. Alternatively it is not excluded that some or all of the functionality of the CPU 402 is implemented in dedicated hardware circuitry, or configurable hardware circuitry like an FPGA.

The computing device 400 comprises an input device 404 configured to enable a user to input data into a software program running on the CPU 402 for the simulation of an electromagnetic response of a candidate metrology target. The input device 404 may comprise a mouse, keyboard, touchscreen, microphone etc. The computing device 400 further comprises an output device 406 configured to output results of the simulation to the user. The output device 406 may for example be a display (which may comprise a touchscreen) or a speaker.

Figure 5A:
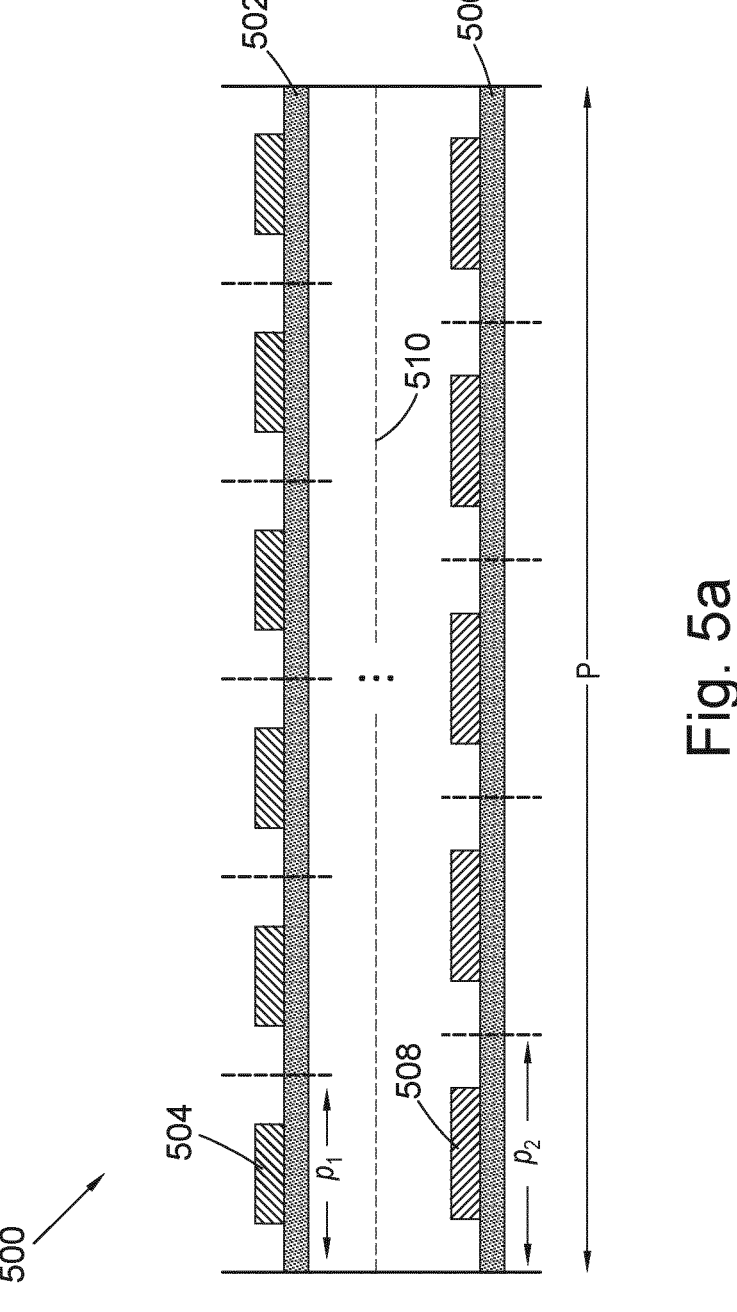
FIG. 5a schematically depicts a portion of a metrology target the electromagnetic response of which may be simulated in embodiments of the present disclosure.

FIG. 5a schematically depicts a portion 500 of a metrology target the electromagnetic response of which may be simulated by the software program running on the CPU 402 in embodiments of the present disclosure.

As shown in FIG. 5a, the portion 500 of the metrology target comprises a top grating (also referred to herein as a first grating) 504 on a first substrate 502 and a bottom grating (also referred to herein as a second grating) on a second substrate 506, wherein the bottom grating is below the top grating. Whilst embodiments of the present disclosure are described with reference to the simulation of a metrology target comprising two gratings for simplicity, it will be appreciated that embodiments of the present disclosure extend to metrology targets having more than two layers of gratings. FIG. 5a shows a gap between the first substrate 502 and second substrate 506. It will be appreciated that the first substrate may extend down to the second substrate 506. Alternatively this gap may comprise one or more additional layers of material.

The top grating has a first predetermined number (n1) of grating lines 504 within a pitch P of the portion 500 of the metrology target. FIG. 5a shows the top grating having 6 grating lines as a mere example (i.e. n1=6). All of the grating lines 504 on the top grating are identical (e.g. in dimensions and material).

The bottom grating has a second predetermined number (n2) of grating lines 506 within the pitch P of the portion 500 of the metrology target. FIG. 5a shows the bottom grating having 5 grating lines as a mere example (i.e. n2=5). All of the grating lines 506 on the bottom grating are identical (e.g. in dimensions and material).

Figures 5B, 5C:
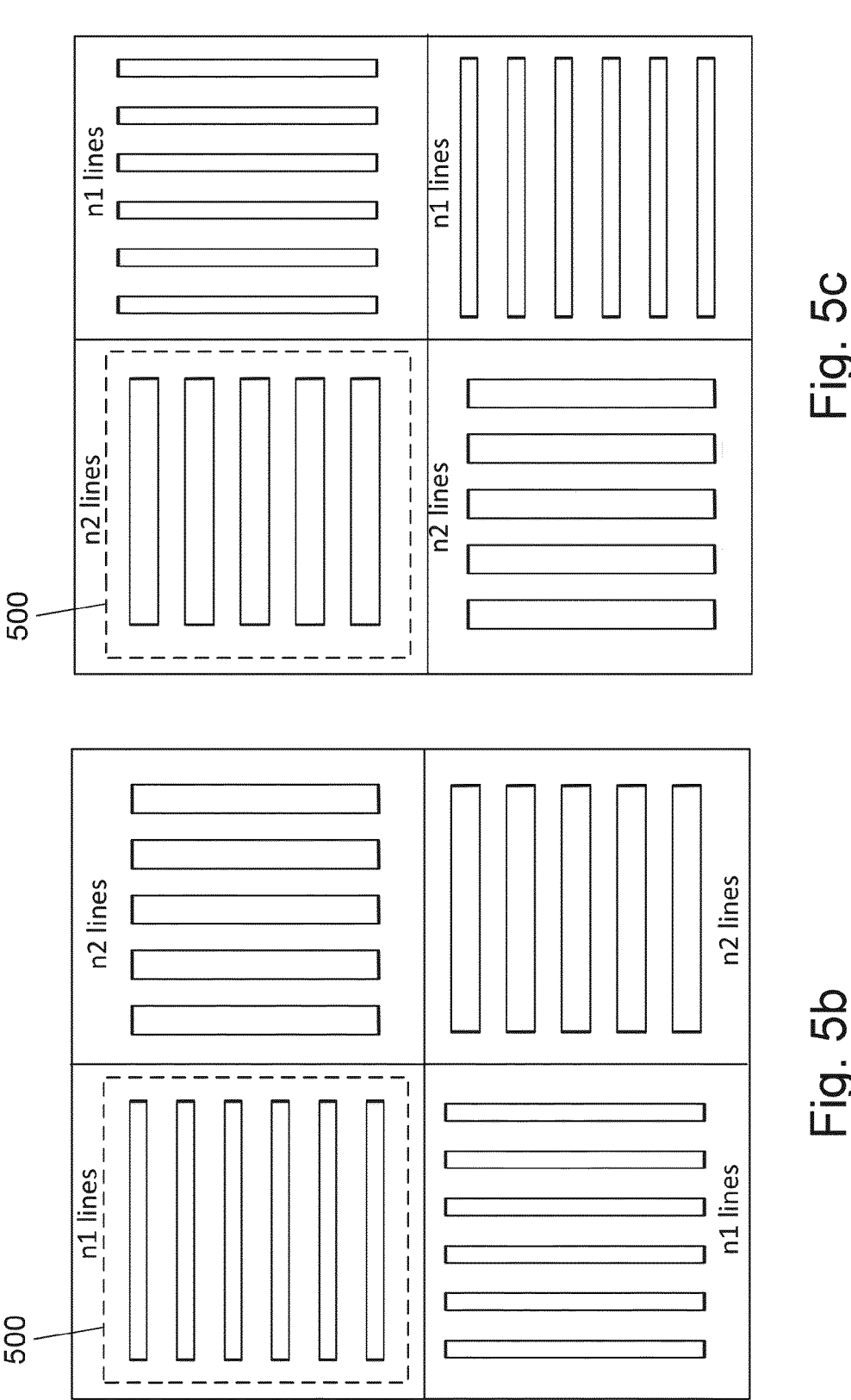
FIGS. 5b and 5c illustrates a top view of an upper grating and a lower grating of an example metrology target the electromagnetic response of which may be simulated in embodiments of the present disclosure.
Figure 5D:
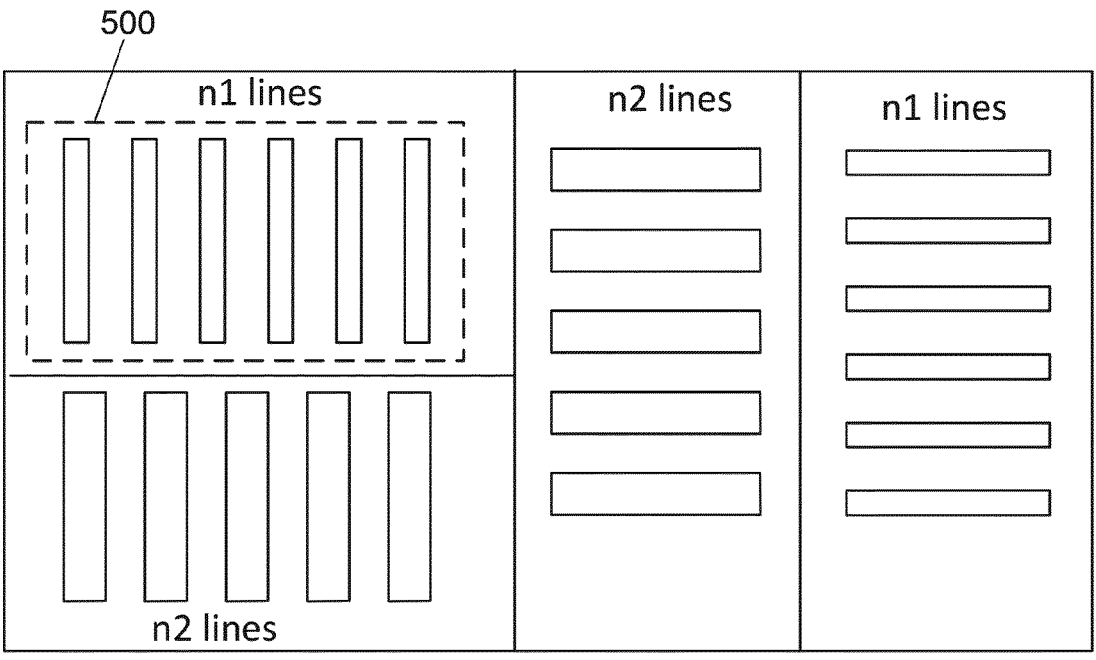
FIGS. 5d and 5e illustrates a top view of an upper grating and a lower grating of another example metrology target the electromagnetic response of which may be simulated in embodiments of the present disclosure.

The portion 500 represents a cell defining the boundaries of a periodic structure, and is thus referred to herein as a unit cell of size Pnm. Each of the first predetermined number of grating lines within the pitch P of the unit cell are separated by a first sub-pitch p1, and each of the second predetermined number of grating lines within the pitch P of the unit cell are separated by a second sub-pitch p2. In the unit cell 500 shown in FIG. 5a, the sub-pitch $p_1$ is different from the sub-pitch $p_2$ resulting in a large pitch P of the unit cell where P=6$p_1$=5$p_2$. Whilst FIG. 5a shows a portion 500 of the metrology target where the first predetermined number n1 of grating lines 504 is greater than the second predetermined number n2 of grating lines 508 such that the first sub-pitch p1 is less than the second sub-pitch p2, as shown in FIGS. 5b-5d in another portion of the metrology target the first predetermined number n1 of grating lines 504 is less than the second predetermined number n2 of grating lines 508 such that the first sub-pitch p1 is greater than the second sub-pitch p2. As mere examples, p1 may equal 500 nm and p2 may equal 600 nm resulting in the pitch P of the unit cell being 3000 nm.

FIG. 5b illustrates a top view of a top grating of an example metrology target incorporating the portion 500, and FIG. 5c illustrates a top view of a bottom grating of the example metrology target shown in FIG. 5b. As shown in FIGS. 5b and 5c, the metrology target comprises four sections. In the top left section (comprising portion 500), on the top grating the periodicity of the n1 lines runs along the vertical direction (with the lines themselves being orientated horizontally) and on the bottom grating the periodicity of the n2 lines runs along the vertical direction. In the top right section, on the top grating the periodicity of the n2 lines runs along the horizontal direction and on the bottom grating the periodicity of the n1 lines runs along the horizontal direction. In the bottom left section, on the top grating the periodicity of the n1 lines runs along the horizontal direction and on the bottom grating the periodicity of the n2 lines runs along the horizontal direction. In the bottom right section, on the top grating the periodicity of the n2 lines runs along the vertical direction and on the bottom grating the periodicity of the n1 lines runs along the vertical direction. The overlay error between two layers on a substrate is measured using an image of the metrology target, i.e., that is in an active area of a substrate. By illuminating the metrology target from two opposing directions (each direction by itself being a cone of light and thus containing many different angles of incidence). The two images coming from the two (opposing) illuminations are then analyzed to extract overlay. This analysis may comprise computing a phase difference between top and bottom gratings (which manifest as an intensity fringe pattern that translates as a function of overlay).

In a variant of the metrology target shown in FIGS. 5b and 5c, an alternative metrology target may have the horizontal and vertical swapped around such that for the top left section (corresponding to portion 500), on the top grating n1 lines would run horizontally and on the bottom grating n2 lines would run horizontally, and so on.

Figure 5E:
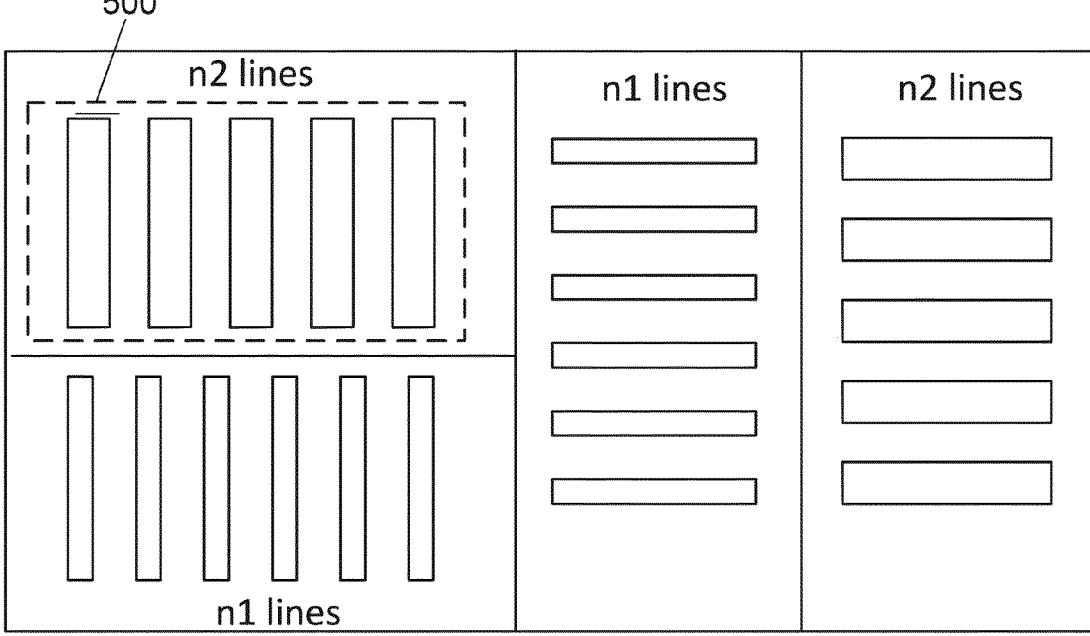

FIG. 5d illustrates a top view of a top grating of another example metrology target incorporating the portion 500, and FIG. 5e illustrates a top view of a bottom grating of the example metrology target shown in FIG. 5d.

In the metrology target shown in FIGS. 5b-e, for simplicity each quadrant is shown as corresponding to the large pitch P of the unit cell. However it will be appreciated that in some implementations there may be multiple (e.g. 2 or 3 or more) repeats of the large pitch P in a quadrant of the metrology target. The computation described herein for a quadrant of a metrology target can still be performed based on a single large pitch P.

In all of these examples, the large pitch P of the unit cell directly impacts the runtime of Maxwell solver simulations which scales cubically in unit cell size, i.e. a computational hit of (3000/600)^=125 can be observed. This computational hit makes rigorous simulation of a metrology target design such as that shown in FIG. 5a to be impractical or sometimes even impossible.

Embodiments of the present disclosure exploit "sparsity" in the Maxwell solver solution which is present because of the specific design of the metrology target whereby the pitches of the top and bottom gratings are not equal. Although a computational hit will be incurred when moving to such a design from a metrology target whereby the pitches of the top and bottom gratings are equal (because the unit cell inherently grows, i.e. a hit equal to 3000/600=5 is the bare minimum whilst remaining fully rigorous and of similar accuracy), embodiments of the present disclosure are directed at reducing the computational hit as much as possible (i.e. bring the 125 hit as estimated above as close as possible to the optimal hit of 5 for this particular example).

Referring back to the example shown in FIG. 5a, in embodiments of the present disclosure the software program splits the portion 500 of the metrology target into two portions defining a top grating (i.e. a stack above the dashed line 510) and a bottom grating (i.e. a stack below the dashed line 510) respectively. Instead of characterizing the electromagnetic response of the portion 500 of the metrology target in one single shot for the overall pitch P of the unit cell, the invention computes this response in 3 steps:

(i) Building a "full" scattering matrix (S1) of the top grating, the full scattering matrix defining the transmission and reflection properties of the top grating in response to simulating light being incident on an upper surface of the top grating and being incident on a lower surface of the top grating (due to reflection of light caused by the bottom grating)

(ii) Building a "half" scattering matrix (S2) of the bottom grating, the half scattering matrix defining the transmission and reflection properties of the bottom grating in response to only simulating light being incident on a top surface of the bottom grating; and (iii) Combining the 2 scattering matrices via a Redheffer product (at the interface of the dashed line 510).

By cutting up the stack in two pieces, it is possible to dramatically speed up the steps i) and ii). Instead of computing these scattering matrices directly on the overall pitch P of the unit cell, it is actually possible to construct those exact same scattering matrices by solving $n_1=6$ smaller problems of size $p_1$ and $n_2=5$ smaller problems of size $p_2$. This works because, by design of the metrology target shown in FIG. 5$a$, the 6 top grating lines are completely identical to each other and the bottom 5 grating lines are also completely identical to each other.

Figures 6A, 6B, 6C:
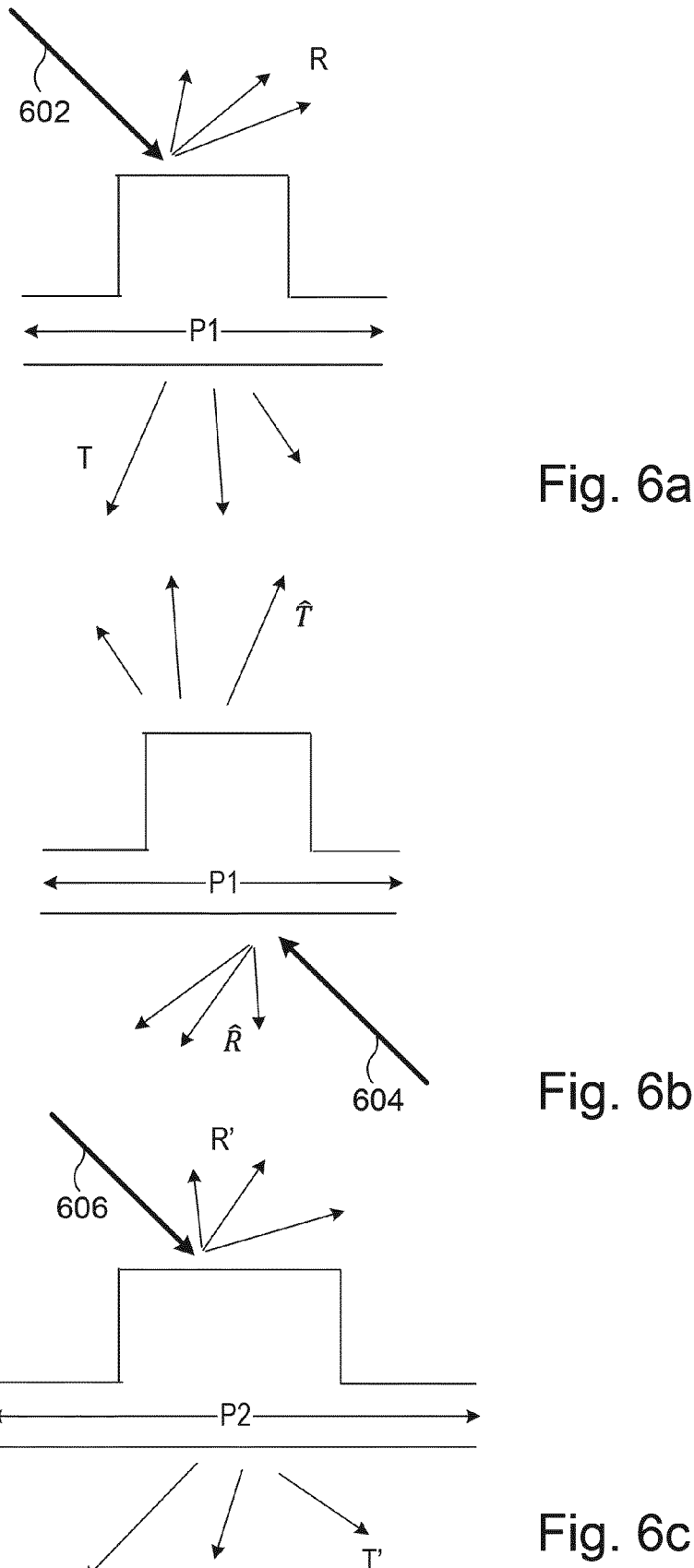
FIG. 6a illustrates transmission and reflection of light caused by light being incident on an upper surface of an upper grating of a metrology target, the grating lines of the upper grating associated with a first pitch.
FIG. 6b illustrates transmission and reflection of light caused by light being incident on a lower surface of an upper grating of a metrology target, the grating lines of the upper grating associated with the first pitch.
FIG. 6c illustrates transmission and reflection of light caused by light being incident on an upper surface of an lower grating of a metrology target, the grating lines of the lower grating associated with a second pitch.

These "smaller problems" are illustrated in FIGS. 6$a$-$c$. In particular, to build the full scattering matrix the software program simulates, for each of n1 angles of incidence of incident light (i) the transmission T and reflection R of light caused by incident light 602 hitting an upper surface of a grating line with pitch p1 (as shown in FIG. 6$a$) and (ii) the transmission $\hat{T}$ and reflection $\hat{R}$ of light caused by incident light 604 hitting a lower surface of a grating line with pitch p1 (as shown in FIG. 6$b$). To build the half scattering matrix the software program simulates, for each of n2 angles of incidence of incident light, the transmission T' and reflection R' of light caused by incident light 606 hitting an upper surface of a grating line with pitch p2 (as shown in FIG. 6$c$).

FIG. 7$a$ illustrates a flowchart of process 700 performed by the CPU 402 (e.g. a software program running on the CPU 402) for simulating an electromagnetic response of a metrology target.

At step S700, the CPU 402 receives a model representing the geometry of the multi-layer structure 500 of the metrology target. The model defines information about the number n1 of grating lines on the substrate 502, the size of the first sub-pitch p1 associated with each of the n1 grating lines, the dimensions of the n1 grating lines on the top grating (this information covers more complicated structures than those shown in FIGS. 5$a,b,d$ including information on whether the n1 grating lines are coated or are asymmetric (due to a different sidewall angle left vs right, or additional "floor-tilt"), the thickness and material of substrate 502, the thickness and material of any further layers between the substrate 502 and the substrate 506, the number n2 of grating lines on the substrate 506, the size of the second sub-pitch p2 associated with each of the n2 grating lines, the dimensions of the n2 grating lines (this information covers more complicated structures than those shown in FIGS. 5$a,c,e$ including information on whether the n2 grating lines are coated or are asymmetric (due to a different sidewall angle left vs right, or additional "floor-tilt"), and the thickness and material of substrate 506.

At step S702, the CPU 402 receives an input defining the position of the cut 510 which splits the multi-layer structure 500 into two portions defining a top grating (i.e. a stack above the dashed line 510) and a bottom grating (i.e. a stack below the dashed line 510). A user of the computing device 400 may supply the input and thus make the decision on where the cut 510 should be taken (i.e. the height of the cut 510 above the substrate 506). Alternatively a software program running on the CPU 402 (which may be the same or a different software program to the one described herein which simulates the electromagnetic response of a metrology target) may determine, based on the geometry of the multi-layer structure 500, where the cut 510 should be taken to efficiently split the computational load of determining the full scattering matrix (S1) and the half scattering matrix (S2).

The CPU 402 also receives parameters associated with the light that will be incident on the metrology target once fabricated on a substrate. These parameters may include one or more of the wavelength of the incident light, angle(s) of incidence relating to the large pitch P of the unit cell, whether the angle of incidence causes planar or conical diffraction (e.g. whether the simulated has an in-plane angle of incidence causing planar diffraction, or an out-of-plane angle of incidence causing conical diffraction) and the polarization of the light (e.g. TE (Transverse Electric), TM (Transverse Magnetic or combined TE&TM polarization). As described below, for a single angle of incidence relating to the large pitch P of the unit cell, n1 angles of incident for pitch p1 are used by a Maxwell solver component and n2 angles of incident for pitch p2 are used by a Maxwell solver component. The embodiments are described below with reference to the analysis using a single angle of incidence relating to the large pitch P of the unit cell. This may for example be an average angle of incidence of multiple angles illuminating the large pitch P of the unit cell.

At step S704 the CPU 402 uses the model (and in particular the first pitch p1) and the parameters associated with the incident light to simulate the transmission and reflection properties of the top grating and generate a full scattering matrix S1 associated with the top grating.

Step S704 comprises using the model to simulate the transmission and reflection properties of the top grating and thereby generate a first block-diagonal matrix, $S_{topBD}$, associated with the top grating, and then reordering the first block-diagonal matrix, $S_{topBD}$, to generate the full scattering matrix S1

We describe step S704 with reference to an example where the top grating has 3 grating lines (n1=3).

At step S704, a number of calls are made to a Maxwell solver component of the software program running on the CPU 402. The Maxwell solver component may use the known Rigorous Coupled Wave Analysis (RCWA) algorithm however other types of Maxwell solver may be utilized in embodiments of the present disclosure. As will be appreciated by persons skilled in the art, the number of calls to the Maxwell solver component is dependent on the polarization mode of the simulated light that is incident on the metrology target. Embodiments are described herein with reference to an example of simulating TE (Transverse Electric) polarized light. In these examples, n1 calls are made to the Maxwell solver component. During each call to the Maxwell solver component input data is supplied to the Maxwell solver component. The input data comprises (i) the sub-pitch p1 value; (ii) information defining the geometry of a grating line on the top grating; (iii) information relating to the substrate 502 and any further layers within the top grating; (iv) the one or more parameters associated with the light that will be incident on the metrology target; and (v)

information relating to a material assigned as a temporary halfspace below the cut 510 after step S702 is performed. It will be appreciated that some of the above input data (e.g. the sub-pitch p1 value) is constant for each call to the Maxwell solver component, whereas some of the input data will be different for each call to the Maxwell solver component (e.g. the angle of incidence associated with the light that will be incident on the metrology target).

Each of the calls to the Maxwell solver component result in the Maxwell solver component outputting a scattering matrix $S_{topn}$ where n defines the Maxwell solver component call number (i.e. n=1 refers to a first call to the Maxwell solver component using a first angle of incidence). Thus if the top grating has n1 grating lines, n1 calls to the calls to the Maxwell solver component are made.

Figure 7B:
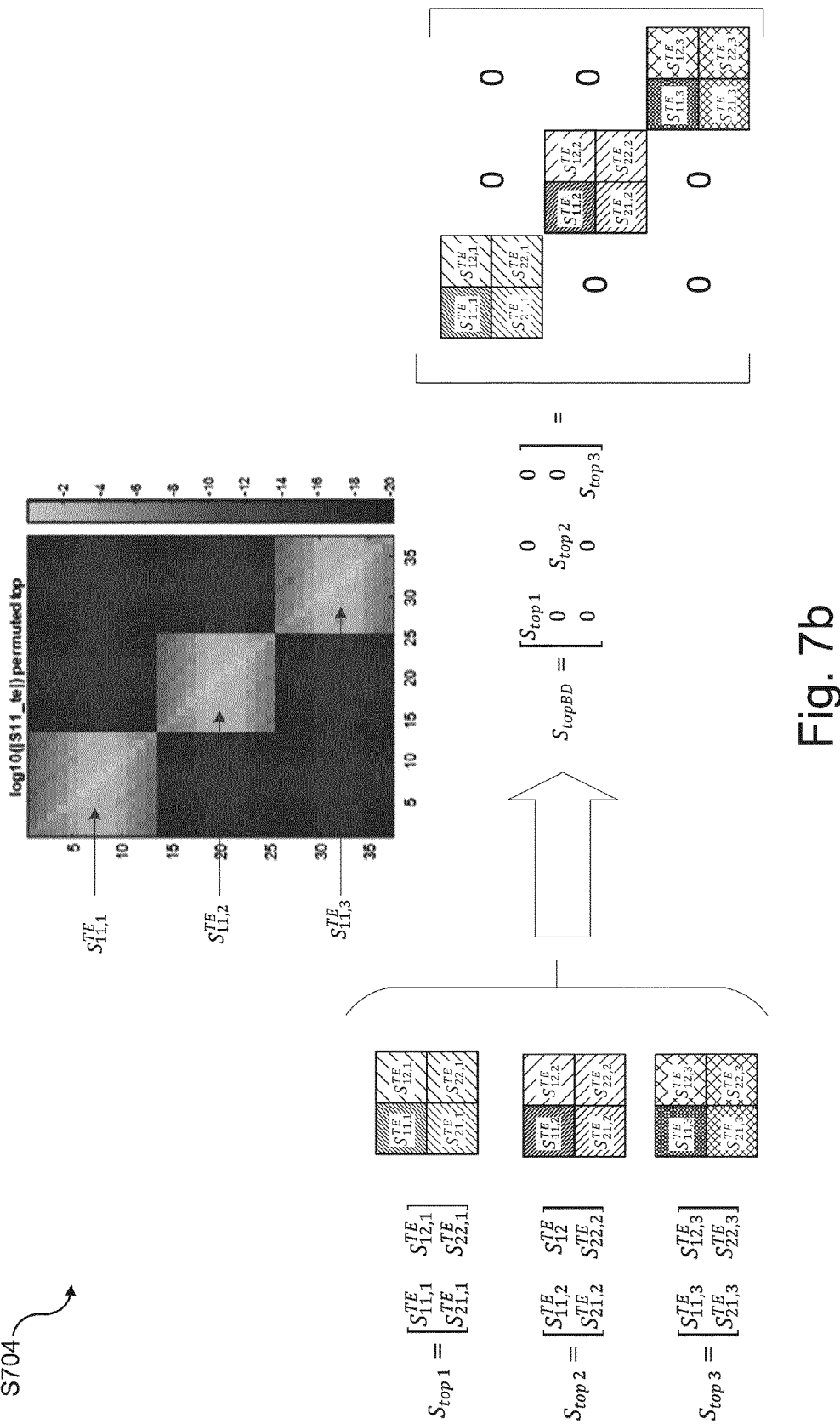
FIG. 7b illustrates the use of a model representing a metrology target to simulate the transmission and reflection properties of the upper grating and thereby generate a first block-diagonal matrix associated with the upper grating.

FIG. 7b illustrates a first scattering matrix $S_{top1}$ that is output by the Maxwell solver component, a second scattering matrix $S_{top2}$ that is output by the Maxwell solver component, and a third scattering matrix $S_{top3}$ that is output by the Maxwell solver component.

Each of the scattering matrices $S_{topn}$ have the following structure:

$$\begin{bmatrix} s_{11,n}^{TE} & s_{12,n}^{TE} \\ s_{21,n}^{TE} & s_{22,n}^{TE} \end{bmatrix}$$

Where:

n defines the Maxwell solver component call number

S11 is a scattering matrix defining the transmission properties of the top grating in response to simulating light being incident on an upper surface of the top grating;

S12 is a scattering matrix defining the reflection properties of the top grating in response to simulating light being incident on a lower surface of the top grating;

S21 is a scattering matrix defining the reflection properties of the top grating in response to simulating light being incident on an upper surface of the top grating; and S22 is a scattering matrix defining the transmission properties of the top grating in response to simulating light being incident on a lower surface of the top grating As shown in FIG. 7b and described above, reference is made herein to TE (Transverse Electric) polarized light, however as described in more detail below this is just an example and embodiments of the present disclosure extend to simulating an electromagnetic response of a metrology target in response to light of other polarizations being incident on the metrology target.

At step S704, uses the scattering matrices output by the Maxwell solver component to generate a first block-diagonal matrix, $S_{topBD}$, associated with the top grating, wherein the scattering matrices output by the Maxwell solver component populate the diagonal elements of the first block-diagonal matrix, $S_{topBD}$. The remaining elements of the first block-diagonal matrix, $S_{topBD}$, have a zero value. The first block-diagonal matrix, $S_{topBD}$, has a size n1×n1 where n1 corresponds to the number of grating lines on the top grating.

FIG. 7b illustrates a sparsity pattern log 10 plot that is present in a typical block-diagonal matrix (where the top grating contains 3 lines).

Figure 7C:
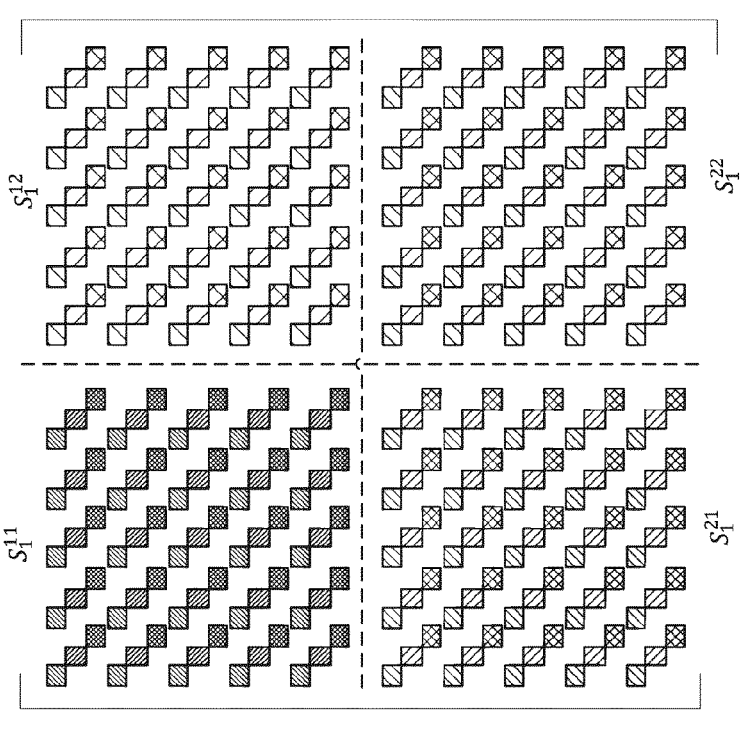
FIG. 7c illustrates reordering of the first block-diagonal matrix to generate a scattering matrix associated with the upper grating.

At step S704, the CPU 402 then reorders the first block-diagonal matrix, $S_{topBD}$, to generate the full scattering matrix S1, this is illustrated in FIG. 7c. This reordering comprises populating a first scattering matrix component $$s_1^{11}$$

of the full scattering matrix S1 with values taken from each diagonal element from the first block-diagonal matrix, $S_{topBD}$, populating a second scattering matrix component $$s_1^{21}$$

of the full scattering matrix S1 with values taken from each diagonal element from the first block-diagonal matrix, $S_{topBD}$, populating a third scattering matrix component $$s_1^{12}$$

of the full scattering matrix S1 with values taken from each diagonal element from the first block-diagonal matrix, $S_{topBD}$, and populating a fourth scattering matrix component $$s_1^{22}$$

of the full scattering matrix S1 with values taken from each diagonal element from the first block-diagonal matrix, $S_{topBD}$.

As shown in FIG. 7c, the scattering matrix S11,1 defined within the first block-diagonal matrix, $S_{topBD}$ is distributed within the first scattering matrix component $$s_1^{11}$$

of the full scattering matrix S1 separated by zero values. The scattering matrix S21,1 defined within the first block-diagonal matrix, $S_{topBD}$ is distributed within the second scattering matrix component $$s_1^{21}$$

of the full scattering matrix S1 separated by zero values. The scattering matrix S12,1 defined within the first block-diagonal matrix, $S_{topBD}$ is distributed within the third scattering matrix component $$s_1^{12}$$

of the full scattering matrix S1 separated by zero values. The scattering matrix S22,1 defined within the first block-diagonal matrix, $S_{topBD}$ is distributed within the fourth scattering matrix component $$s_1^{22}$$

of the full scattering matrix S1 separated by zero values.

This process is repeated for the other diagonal elements of the first block-diagonal matrix, $S_{topBD}$, i.e. for the second scattering matrix $S_{top2}$ that is output by the Maxwell solver component, and the third scattering matrix $S_{top3}$ that is output by the Maxwell solver component.

The full scattering matrix S1 corresponds to the scattering matrix that would have been obtained for the top grating if it had been computed directly on the overall pitch P of the unit cell 500 but it is computed in embodiments of the present disclosure in a more computationally efficient manner.

At step S706 the CPU 402 uses the model (and in particular the second pitch p2) and the parameters associated with the incident light to simulate the transmission and reflection properties of the bottom grating and generate a half scattering matrix S2 associated with the bottom grating. It will be appreciated that in principle a full scattering matrix for the bottom grating (similarly as described previously for the top grating) could also be built, but this would involve incurring computational resource unnecessarily since half of the content of such a full scattering matrix would not be used.

Step S706 comprises the CPU 402 using the model to simulate the transmission and reflection properties of the bottom grating and thereby generate a second block-diagonal matrix, $S_{botBD}$, associated with the bottom grating, and then reordering the second block-diagonal matrix, $S_{botBD}$, to generate the half scattering matrix S2.

We describe step S706 with reference to an example where the bottom grating has 2 grating lines (n2=2).

At step S706, a number of calls are made to a Maxwell solver component of the software program running on the CPU 402. As will be appreciated by persons skilled in the art, the number of calls to the Maxwell solver component is dependent on the polarization mode of the simulated light that is incident on the metrology target. Embodiments are described herein with reference to simulating TE (Transverse Electric) polarized light. In these examples, n2 calls are made to the Maxwell solver component. During each call to the Maxwell solver component input data is supplied to the Maxwell solver component. The input data comprises (i) the sub-pitch p2 value; (ii) information defining the geometry of a grating line on the bottom grating; (iii) information relating to the substrate 506 and any further layers within the bottom grating; (iv) the one or more parameters associated with the light that will be incident on the metrology target; and (v) information relating to a material assigned as a temporary halfspace above the cut 510 after step S702 is performed (which is to be the same as what was chosen for the top grating assigned below the cut). The choice for this material will not impact the rigorous combining of the full scattering matrix S1 and the half scattering matrix S2 but may be selected to optimize the combining at step S708 when this is performed approximately. It will be appreciated that some of the above input data (e.g. the sub-pitch p2 value) is constant for each call to the Maxwell solver component, whereas some of the input data will be different for each call to the Maxwell solver component (e.g. the angle of incidence associated with the light that will be incident on the metrology target).

Each of the calls to the Maxwell solver component result in the Maxwell solver component outputting a scattering matrix $S_{botn}$ where n defines the Maxwell solver component call number (i.e. n=1 refers to a first call to the Maxwell solver component using a first angle of incidence). Thus if the bottom grating has n2 grating lines, n2 calls to the Maxwell solver component are made.

Figure 7D:
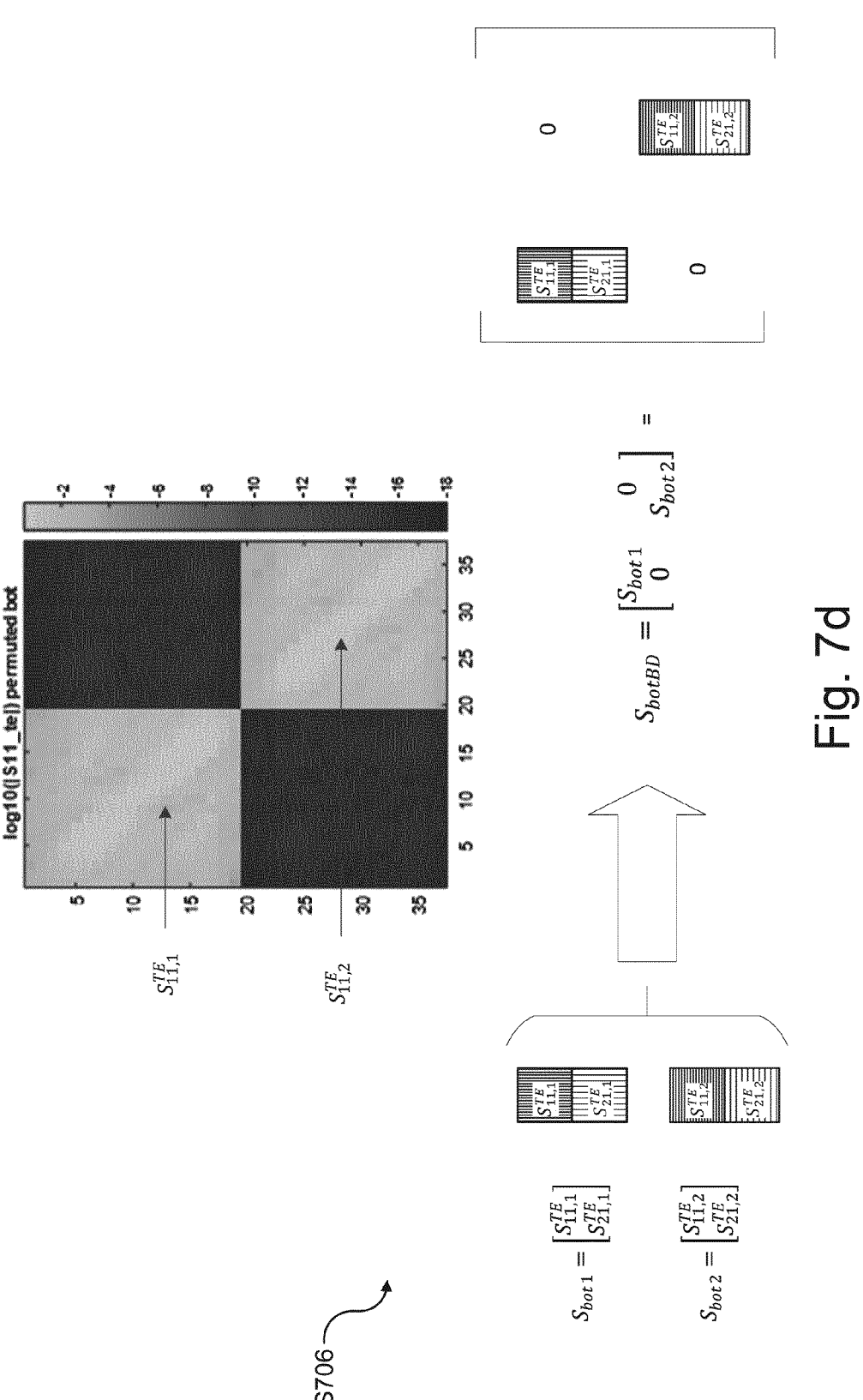
FIG. 7d illustrates the use of a model representing a metrology target to simulate the transmission and reflection properties of the lower grating and thereby generate a second block-diagonal matrix associated with the lower grating.

FIG. 7d illustrates a first scattering matrix $S_{bot1}$ that is output by the Maxwell solver component, and a second scattering matrix $S_{bot2}$ that is output by the Maxwell solver component.

Each of the scattering matrices $S_{botn}$ have the following structure:

$$\begin{bmatrix} S_{11,n}^{TE} \\ S_{21,n}^{TE} \end{bmatrix}$$

Where:

n defines the Maxwell solver component call number

S11 is a scattering matrix defining the transmission properties of the bottom grating in response to simulating light being incident on an upper surface of the bottom grating;

S21 is a scattering matrix defining the reflection properties of the bottom grating in response to simulating light being incident on an upper surface of the bottom grating; and As shown in FIG. 7d and described above, reference is made herein to TE (Transverse Electric) polarized light, however as described in more detail below this is just an example and embodiments of the present disclosure extend to simulating an electromagnetic response of a metrology target in response to light of other polarizations being incident on the metrology target.

At step S706, the CPU 402 uses the scattering matrices output by the Maxwell solver component to generate a second block-diagonal matrix, $S_{botBD}$, associated with the bottom grating, wherein the scattering matrices output by the Maxwell solver component populate the diagonal elements of the second block-diagonal matrix, $S_{botBD}$. The remaining elements of the second block-diagonal matrix, $S_{botBD}$, have a zero value. The second block-diagonal matrix, $S_{botBD}$, has a size n2×n2 where n2 corresponds to the number of grating lines on the bottom grating.

FIG. 7d illustrates a sparsity pattern log 10 plot that is present in a typical block-diagonal matrix (where the bottom grating contains 2 lines).

Figure 7E:
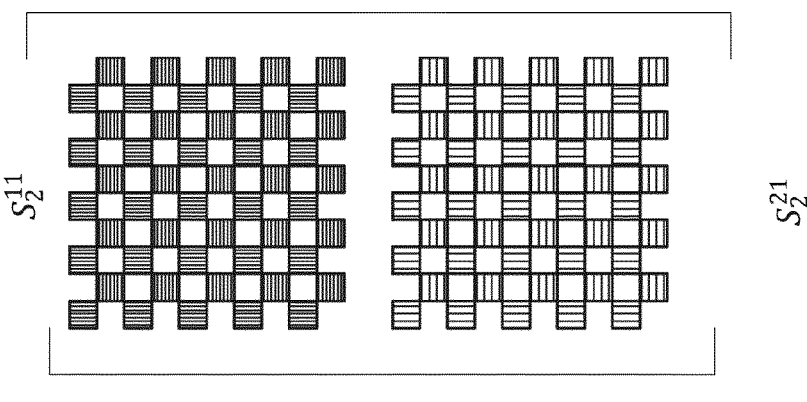
FIG. 7e illustrates reordering of the second block-diagonal matrix to generate a scattering matrix associated with the lower grating.
Figure 7E:
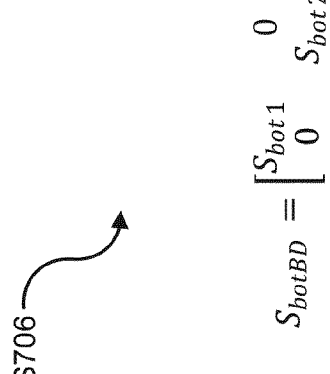

At step S706, the CPU 402 then reorders the second block-diagonal matrix, $S_{botBD}$, to generate the half scattering matrix S2, this is illustrated in FIG. 7e. This reordering comprises populating a fifth scattering matrix component $$S_2^{11}$$

of the half scattering matrix S2 with values taken from each diagonal element from the second block-diagonal matrix, $S_{botBD}$, and populating a sixth scattering matrix component $$S_2^{21}$$

of the half scattering matrix S2 with values taken from each diagonal element from the second block-diagonal matrix, $S_{botBD}$, As shown in FIG. 7e, the scattering matrix S11,1 defined within the second block-diagonal matrix, $S_{botBD}$ is distributed within the fifth scattering matrix component $$S_1^{11}$$

of the half scattering matrix S2 separated by zero values. The second scattering matrix S21,1 defined within the second block-diagonal matrix, $S_{botBD}$ is distributed within the sixth scattering matrix component $$S_2^{21}$$

of the half scattering matrix S2 separated by zero values.

This process is repeated for the other diagonal element of the second block-diagonal matrix, $S_{botBD}$, i.e. for the second scattering matrix $S_{bot2}$ that is output by the Maxwell solver component.

The half scattering matrix S2 corresponds to the scattering matrix that would have been obtained for the bottom grating if it had been computed directly on the overall pitch P of the unit cell 500 but it is computed in embodiments of the present disclosure in a more computationally efficient manner.

In step S704 and step S706 described above, the Maxwell solver component may use the known Rigorous Coupled Wave Analysis (RCWA) algorithm. In RCWA periodic boundary conditions are assumed and the geometry is discretized using Fourier series. For a single line with pitch $p_1$ we would have a Toeplitz matrix of the form:

$$(E_{P_1})_{ij} = e_{i-j} \tag{1}$$

where the coefficients $e_i$ are the Fourier coefficients of a single line. For the top grating containing 6 lines within a large pitch P of the unit cell 500 the corresponding Toeplitz matrix is directly linked to (1) via $$(E_P)_{ij} = \begin{cases} e_{i-j}, & \text{for } i-j = 0 \bmod 6, \\ 0, & \text{otherwise.} \end{cases} \tag{2}$$

A similar sparsity (i.e. many zeros in the matrix coefficients) is also observed for the bottom grating where the "mod 6" in Eq. (2) is simply replaced by "mod 5". Because these Toeplitz matrices are sparse, they can be reordered (permuted) to a block-diagonal matrix as described above. The block-diagonal structure is present throughout the whole computational RCWA flow during the computation of the full scattering matrix S1 and the half scattering matrix S2. That is, the computationally expensive operations in RCWA (i.e. matrix diagonalizations and matrix inversions) which scale cubically in the size of the matrix are performed at the block level and thus advantageously saving computational time.

At step S708, the CPU 402 then combines the first scattering matrix (e.g. the full scattering matrix S1) and the second scattering matrix (e.g. the half scattering matrix S2) to generate a scattering matrix $S_{target}$ defining the scattering and reflection properties of the metrology target. The step S708, can be performed rigorously or approximately.

At step S708 where the scattering matrices of the top and bottom grating are glued together the computation comprises a matrix inversion that no longer has this block structure referred to above, if the matrix inversion is performed exactly and thus remains fully rigorous. More preciously, let $$S_1 = [S_1^{11}, S_1^{12}; S_1^{21}, S_1^{22}]$$

be the full scattering matrix S1 of the top grating and let $$S_2 = [S_2^{11}; S_2^{21}]$$

be half of the scattering matrix of the bottom grating. Then the scattering matrix of the full portion 500 of the metrology target is constructed via the Redheffer product (i.e. $S_{target} = S_1 \otimes_R S_2$). In an example application where only the upper surface of the metrology is to be illuminated, only the elements $$S_{target}^{11} \text{ and } S_{target}^{21}$$

are needed (which is why for the bottom grating only half of its scattering matrix is required). Their expression is given by:

$$s_{target}^{11} = S_2^{11}(I - S_1^{12}S_2^{21})^{-1}S_1^{11},$$

$$s_{target}^{21} = S_1^{22}S_2^{11}(I - S_1^{12}S_2^{21})^{-1}S_1^{11} + S_1^{21}.$$

It is the matrix inversion, $$(I - S_1^{12}S_2^{21})^{-1},$$

that is still the overall expensive operation. This is because although $S_1$ and $S_2$ on their own have a block-structure, their product does not (because the top and bottom grating have a different number of lines that make up the large pitch P of the unit cell 500).

Since this matrix inversion is the only expensive operation left in the whole flow, it is also possible to consider using an approximate inversion. One example of an approximate inversion is using a geometric series, i.e.

$$(I - X)^{-1} = \sum_n X^n \tag{3}$$

Where $$X = S_1^{12}S_2^{21}$$

n=summation index

Depending on the spectral properties of the matrix X this series may converge. If it does converge, the summation index n is a mechanism with which the accuracy of the approximation can be controlled. Furthermore, the expensive matrix inversion would then be replaced by matrix multiplications, and full advantage of the block-structure that is present in the individual scattering matrices can be taken. After cutting the stack in two at step S702, an artificial substrate and superstrate may be assigned to the top and bottom stacks respectively. Although they need to be chosen identical for the simulation, they can be completely different from either the real superstrate or substrate that will be utilized in the real-world application. The selection of the artificial substrate and superstrate may be tuned to improve the approximation in equation (3).

Embodiments of the present disclosure extend to using other approximations that may have more favorable spectral properties in terms of convergence than the one mentioned in equation (3). For example, one could also consider solving the matrix inversion (or its associated linear system) by using an iterative solver.

In order to quantify the improvement provided by embodiments of the present disclosure, we introduce a parameter which is the number of (vertical) layers L in the full grating (i.e. the unit cell 500). For simplicity we assume that we can cut the full grating in roughly two equal halves.

The reference (acceptable) simulation time corresponds to a reference grating where the grating lines of the upper grating and the lower grating are equal, i.e. have the same pitch of pitch $p_2$ (largest of the two pitches).

A naïve implementation which solves directly for the full grating (i.e. the unit cell 500) where the upper grating and the lower grating are unequal, would get an unacceptable computational hit (relative to the above simulation of the reference grating) which is equal to $$n_2^3 (= 5^3 = 125$$

for the example depicted in FIG. 5a).

Assuming the matrix diagonalizations and matrix inversions roughly each take 50% of the overall time (the former can be reused when building the second half of a full scattering matrix), then the computational hit (relative to the above simulation of the reference grating is
steps S704 and S706: 1.5 $n_2$
step S708:
rigorously:

$$n_2^3/L$$

approximately: c n $n_2$
(for a small constant c and where n is the truncation parameter in Eq. (3))
In summary:
A) for a fully rigorous scenario the overall computational hit is $$1.5 n_2 + \frac{n_2^3}{L}$$

B) for an approximate scenario the overall computational hit is 1.5 $n_2$+c n $n_2$
Cleary both scenarios result in a much smaller computational hit than the naïve implementation of $$n_2^3.$$

Especially when one also wants to model gratings with a sidewall angle different from 90 degrees (i.e. number of layers L becomes large) then the cubic hit for the fully rigorous solution becomes much smaller. The approximate scenario scales even fully linear in the number of lines $n_2$ and when the constant in front remains rather small this is actually close to the best-case computational hit that you are always expected to achieve.

At step S710, the CPU 402 may determine one or more parameters associated with the electromagnetic response of the candidate metrology target using the scattering matrix $S_{target}$. The parameters are known to persons skilled in the art and may include for example reflection values, sensitivity to overlay, robustness against nuisance parameters (e.g. sidewall angle asymmetry) etc.

Embodiments of the present disclosure have been described above with reference to simulating the performance of a candidate metrology target using only one quadrant of the candidate metrology target. That is, the scattering matrix $S_{target}$ determined at step S710 is associated with a single quadrant of a candidate metrology target. It will be appreciated that embodiments of the present disclosure extend to simulating the performance of a candidate metrology target using multiple quadrants of the candidate metrology target, where steps S700-S708 of FIG. 7a are performed per quadrant and step S710 is performed using the multiple generated scattering matrices. For example in some implementations, steps S700-S708 of FIG. 7a are performed twice with step S710 being performed using two generated scattering matrices.

With reference to FIGS. 5b and 5c, in order to retrieve overlay for lines that are periodic in the vertical direction the electromagnetic response of the top left and bottom right quadrants can be simulated using embodiments of the present disclosure. In order to retrieve overlay for lines that are periodic in the horizontal direction the electromagnetic response of the top right and bottom left quadrants can be simulated using embodiments of the present disclosure. It will be appreciated that in some implementations, steps S700-S708 of FIG. 7a are performed four times to generate four scattering matrices (each associated with a respective quadrant of the metrology target) to rigorously simulate the electromagnetic response of the candidate metrology target. Whilst embodiments have been described above with reference to characterizing the electromagnetic response of a quadrant of the candidate metrology target using a single angle of incidence relating to the large pitch P of the unit cell, it will be appreciated that more than one angle of incidence may be used to simulate the electromagnetic response of a quadrant of the candidate metrology target. In these implementations the process described herein for characterizing the electromagnetic response of a quadrant of the candidate metrology target is repeated for each angle of incidence relating to the large pitch P of the unit cell.

Embodiments of the present disclosure extend to a computer implemented method of designing a metrology target for a semiconductor wafer, the metrology target having a multi-layer structure comprising a first grating and a second grating, wherein the second grating is below the first grating in the multi-layer structure, the method comprising: for each of a plurality of candidate metrology targets, performing the method described herein and determining one or more parameters associated with the electromagnetic response of the candidate metrology target using the scattering matrix of the candidate metrology target; and identifying a candidate metrology target from said plurality of candidate metrology targets that optimizes said one or more parameters. This method of designing a metrology target for a semiconductor wafer may comprises performing the method described herein for a predetermined number of candidate metrology targets after which the identifying is performed. Alternatively, this method of designing a metrology target for a semiconductor wafer may comprise repeating the method described herein for different candidate metrology targets until a candidate metrology target is found which satisfies predetermined criteria relating to the one or more parameters.

Whilst the methods described herein have been described with reference to a first (upper) grating and the second (lower) grating being unequal (i.e. different pitches), the methods described herein can also be used to simulate the performance of structures where the number of grating lines of the upper grating and the lower grating are equal, i.e. have the same pitch).

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Further embodiments according to the present invention are described in below numbered clauses:

1. A computer implemented method of simulating an electromagnetic response of a metrology target having a multi-layer structure comprising a first grating and a second grating, wherein the second grating is below the first grating in the multi-layer structure, the method comprising:

receiving a model representing the multi-layer structure, the model defining (i) the first grating as having a first predetermined number of grating lines within a pitch of the multi-layer structure, each of the first predetermined number of grating lines separated by a first pitch; and (ii) the second grating as having a second predetermined number of grating lines within the pitch of the multi-layer structure, each of the second predetermined number of grating lines separated by a second pitch;

using the model and the first pitch to simulate the transmission and reflection properties of the first grating and generate a first scattering matrix associated with the first grating; using the model and the second pitch to simulate the transmission and reflection properties of the second grating and generate a second scattering matrix associated with the second grating; and generating a scattering matrix defining the scattering and reflection properties of the multi-layer structure by combining the first scattering matrix and the second scattering matrix.

2. The computer implemented method of clause 1, comprising:

using the model and the first pitch to simulate the transmission and reflection properties of the first grating to generate a first block-diagonal matrix associated with the first grating; and reordering the first block-diagonal matrix to generate the first scattering matrix associated with the first grating 3. The computer implemented method of clause 2, wherein the first block-diagonal matrix comprises scattering matrices each defining the transmission and reflection properties of the first grating in response to simulating light being incident on an upper surface of the first grating at a respective angle of incidence and being incident on a lower surface of the first grating at a respective angle.

4. The computer implemented method of clause 2 or 3, wherein the first block-diagonal matrix comprises the first predetermined number of scattering matrices.

5. The computer implemented method of any preceding clause, comprising:

using the model and the second pitch to simulate the transmission and reflection properties of the second grating to generate a second block-diagonal matrix associated with the second grating; and reordering the second block-diagonal matrix to generate the second scattering matrix associated with the second grating.

6. The computer implemented method of clause 5, wherein the second block-diagonal matrix comprises scattering matrices each defining the transmission and reflection properties of the second grating in response to simulating light being incident on an upper surface of the second grating at a respective angle of incidence.

7. The computer implemented method of clause 5 or 6, wherein second block-diagonal matrix comprises the second predetermined number of scattering matrices.

8. The computer implemented method of any preceding clause, wherein the first scattering matrix comprises:

(i) a first scattering matrix component defining the transmission properties of the first grating in response to simulating light being incident on an upper surface of the first grating, (ii) a second scattering matrix component defining the reflection properties of the first grating in response to simulating light being incident on an upper surface of the first grating, (iii) a third scattering matrix component defining the reflection properties of the first grating in response to simulating light being incident on a lower surface of the first grating, and (iv) a fourth scattering matrix component defining the transmission properties of the first grating in response to simulating light being incident on a lower surface of the first grating;

wherein the second scattering matrix comprises:

(v) a fifth scattering matrix component defining the transmission properties of the second grating in response to simulating light being incident on an upper surface of the second grating, and (vi) a sixth scattering matrix component defining the reflection properties of the first grating in response to simulating light being incident on an upper surface of the second grating, 9. The computer implemented method of clause 8, wherein combining the first scattering matrix and the second scattering matrix comprises performing a matrix inversion of a matrix obtained by subtracting the product of the third scattering matrix component and the sixth scattering matrix component from an identity matrix.

10. The computer implemented method of clause 8, wherein combining the first scattering matrix and the second scattering matrix comprises approximating a matrix inversion of a matrix obtained by subtracting the product of the third scattering matrix component and the sixth scattering matrix component from an identity matrix.

11. The computer implemented method of clause 10, wherein approximating the matrix inversion comprises using a geometric series.

12. The computer implemented method of clause 10, wherein approximating the matrix inversion comprises using an iterative solver.

13. The computer implemented method of any preceding clause, wherein the scattering matrix defining the scattering and reflection properties of the multi-layer structure is generated by the Redheffer product of the first scattering matrix and the second scattering matrix.

14. The computer implemented method of any preceding clause, further comprising determining one or more parameters associated with the electromagnetic response of the metrology target using the scattering matrix defining the transmission and reflection properties of the multi-layer structure 15. The computer implemented method of any preceding clause, wherein the first predetermined number of grating lines is greater than the second predetermined number of grating lines such that the first pitch is less than the second pitch.

16. The computer implemented method of any of clauses 1 to 14, wherein the first predetermined number of grating lines is less than the second predetermined number of grating lines such that the first pitch is greater than the second pitch.

17. The computer implemented method of any preceding clause, wherein the first predetermined number of grating lines are identical to each other, and the second predetermined number of grating lines are identical to each other.

18. A computer implemented method of designing a metrology target for a semiconductor wafer, the metrology target having a multi-layer structure comprising a first grating and a second grating, wherein the second grating is below the first grating in the multi-layer structure, the method comprising:

for each of a plurality of candidate metrology targets, performing the method of any preceding clause and determining one or more parameters associated with the electromagnetic response of the candidate metrology target using the scattering matrix of the candidate metrology target; and identifying a candidate metrology target from said plurality of candidate metrology targets that optimizes said one or more parameters.

19. A computer-readable storage medium comprising instructions which, when executed by a processor of a computing device cause the computing device to perform the method of any preceding clause.

20. A computing device comprising a processor and memory, the memory storing instructions which, when executed by the processor cause the computing device to perform the method of any of clause 1-18.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A computer implemented method of simulating an electromagnetic response of a metrology target having a multi-layer structure comprising a first grating and a second grating, wherein the second grating is below the first grating in the multi-layer structure, the method comprising:

receiving a model representing the multi-layer structure, the model defining (i) the first grating as having a first predetermined number of grating lines within a pitch of the multi-layer structure, each of the first predetermined number of grating lines separated by a first pitch; and (ii) the second grating as having a second predetermined number of grating lines within the pitch of the multi-layer structure, each of the second predetermined number of grating lines separated by a second pitch;

using the model and the first pitch to simulate the transmission and reflection properties of the first grating and generate a first scattering matrix associated with the first grating;

using the model and the second pitch to simulate the transmission and reflection properties of the second grating and generate a second scattering matrix associated with the second grating; and generating a scattering matrix defining the scattering and reflection properties of the multi-layer structure by combining the first scattering matrix and the second scattering matrix.

2. The computer implemented method of claim 1, comprising:

using the model and the first pitch to simulate the transmission and reflection properties of the first grating to generate a first block-diagonal matrix associated with the first grating; and reordering the first block-diagonal matrix to generate the first scattering matrix associated with the first grating.

3. The computer implemented method of claim 2, wherein the first block-diagonal matrix comprises scattering matrices each defining the transmission and reflection properties of the first grating in response to simulating light is incident on an upper surface of the first grating at a respective angle of incidence and is incident on a lower surface of the first grating at a respective angle.

4. The computer implemented method of claim 2, wherein the first block-diagonal matrix comprises the first predetermined number of scattering matrices.

5. The computer implemented method of claim 1, comprising:

using the model and the second pitch to simulate the transmission and reflection properties of the second grating to generate a second block-diagonal matrix associated with the second grating; and reordering the second block-diagonal matrix to generate the second scattering matrix associated with the second grating.

6. The computer implemented method of claim 5, wherein the second block-diagonal matrix comprises scattering matrices each defining the transmission and reflection properties of the second grating in response to simulating light is incident on an upper surface of the second grating at a respective angle of incidence.

7. The computer implemented method of claim 5, wherein second block-diagonal matrix comprises the second predetermined number of scattering matrices.

8. The computer implemented method of claim 1, wherein the first scattering matrix comprises:

(i) a first scattering matrix component defining the transmission properties of the first grating in response to simulating light is incident on an upper surface of the first grating, (ii) a second scattering matrix component defining the reflection properties of the first grating in response to simulating light is incident on an upper surface of the first grating, (iii) a third scattering matrix component defining the reflection properties of the first grating in response to simulating light is incident on a lower surface of the first grating, and (iv) a fourth scattering matrix component defining the transmission properties of the first grating in response to simulating light is incident on a lower surface of the first grating;

wherein the second scattering matrix comprises:

(v) a fifth scattering matrix component defining the transmission properties of the second grating in response to simulating light is incident on an upper surface of the second grating, and (vi) a sixth scattering matrix component defining the reflection properties of the first grating in response to simulating light is incident on an upper surface of the second grating.

9. The computer implemented method of claim 8, wherein combining the first scattering matrix and the second scattering matrix comprises performing a matrix inversion of a matrix obtained by subtracting the product of the third scattering matrix component and the sixth scattering matrix component from an identity matrix.

10. The computer implemented method of claim 8, wherein combining the first scattering matrix and the second scattering matrix comprises approximating a matrix inversion of a matrix obtained by subtracting the product of the third scattering matrix component and the sixth scattering matrix component from an identity matrix.

11. The computer implemented method of claim 10, wherein approximating the matrix inversion comprises using a geometric series.

12. The computer implemented method of claim 10, wherein approximating the matrix inversion comprises using an iterative solver.

13. The computer implemented method of claim 1, wherein the scattering matrix defining the scattering and reflection properties of the multi-layer structure is generated by the Redheffer product of the first scattering matrix and the second scattering matrix.

14. The computer implemented method of claim 1, further comprising determining one or more parameters associated with the electromagnetic response of the metrology target using the scattering matrix defining the transmission and reflection properties of the multi-layer structure.

15. The computer implemented method of claim 1, wherein the first predetermined number of grating lines is greater than the second predetermined number of grating lines such that the first pitch is less than the second pitch.

* * * * *